United States Patent [19]
Inoue et al.

[11] Patent Number: 5,394,491
[45] Date of Patent: Feb. 28, 1995

[54] SEMICONDUCTOR OPTICAL SWITCH AND ARRAY OF THE SAME

[75] Inventors: Hiroaki Inoue, Saitama; Kazuhisa Uomi, Hachioji; Koji Ishida, Musashino, all of Japan

[73] Assignee: Hitachi, Ltd., Tokyo, Japan

[21] Appl. No.: 232,403

[22] Filed: Apr. 25, 1994

Related U.S. Application Data

[63] Continuation-in-part of Ser. No. 96,997, Jul. 27, 1993, abandoned, which is a continuation of Ser. No. 892,782, Jun. 3, 1992, Pat. No. 5,247,592, which is a continuation of Ser. No. 684,378, Apr. 12, 1991, Pat. No. 5,146,513, which is a continuation of Ser. No. 464,192, Jan. 12, 1990, Pat. No. 5,044,745.

[30] Foreign Application Priority Data

Jan. 30, 1989 [JP]  Japan ........................... 1-17604

[51] Int. Cl.[6] .............................................. G02B 6/26
[52] U.S. Cl. ...................................................... 385/16
[58] Field of Search ..................................... 385/14–16, 385/24; 359/139, 158, 164

[56] References Cited

U.S. PATENT DOCUMENTS

| | | | |
|---|---|---|---|
| 4,795,225 | 1/1989 | Sakai et al. | 385/16 |
| 5,044,745 | 9/1991 | Inoue et al. | 385/16 |
| 5,185,830 | 2/1993 | Nishimoto | 385/16 X |
| 5,222,163 | 6/1993 | Handa et al. | 385/14 |

Primary Examiner—Akm E. Ullah
Attorney, Agent, or Firm—Antonelli, Terry, Stout & Kraus

[57] ABSTRACT

A semiconductor optical switch and an optical switch array for use in an optical logic circuit, photonic switching, OEIC, etc., wherein a light amplifying means is provided on a bypass waveguide that connects a plurality of optical waveguides, thereby enabling improvement of the light crosstalk and the light propagation loss. In particular, according to the arrangement of the present invention that a light amplifying means is provided in addition to the deflecting portion, no noise component is amplified and therefore the SN ratio is markedly increased.

8 Claims, 6 Drawing Sheets

SEMICONDUCTOR OPTICAL SWITCH AND ARRAY OF THE SAME

This application is a continuation-in-part of application Ser. No. 096,997, filed on Jul. 27, 1993, now abandoned, which is a continuation of application Ser. No. 892,782, filed Jun. 3, 1992, now U.S. Pat. No. 5,247,592, which is a continuation of application Ser. No. 684,378, filed Apr. 12, 1991, (now U.S. Pat. No. 5,146,513), which is a continuation of application Ser. No. 464,192, filed on Jan. 12, 1990, (now U.S. Pat. No. 5,044,745).

BACKGROUND OF THE INVENTION

1. Field of the Invention

The present invention relates to an optical switch having waveguides. More particularly, the present invention pertains to a semiconductor optical switch which is suitable for use in an optical integrated circuit or opto-electronic integrated circuit employed for optical computing, optical information transmission, etc.

2. Description of the Related Art

The inventors of this application have already made some proposals concerning the structure of semiconductor optical switches, i.e., a semiconductor waveguide type optical switch which has a short device length and therefore enables large scale integration on a semiconductor substrate, a slip structure type optical switch and an integrated semiconductor, waveguide type optical switch which is employed for an photonic switching. We discussed them, for example in IEEE Journal on Selected Areas in Communications, J-SAC-6, pp. 1262–1266, 1988.

Figure 2A:
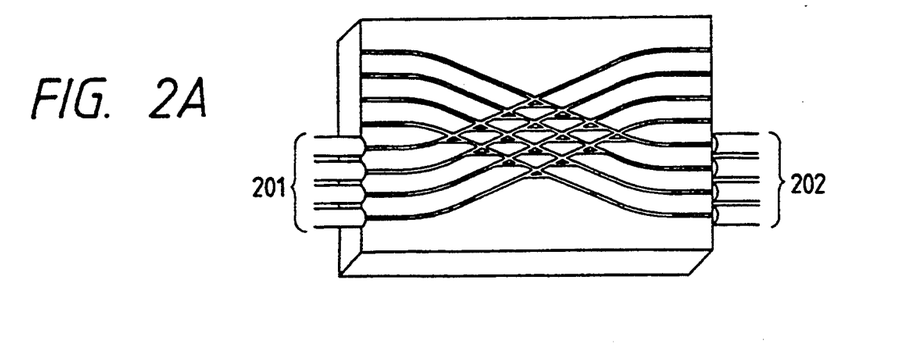
FIGS. 2A, 2B and 2C are views for illustrating a conventional optical switch and optical switch array proposed by the present inventors.
Figure 2B:
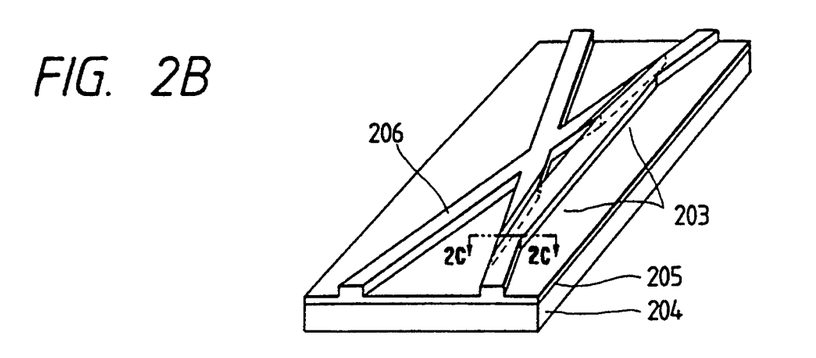
Figure 2C:
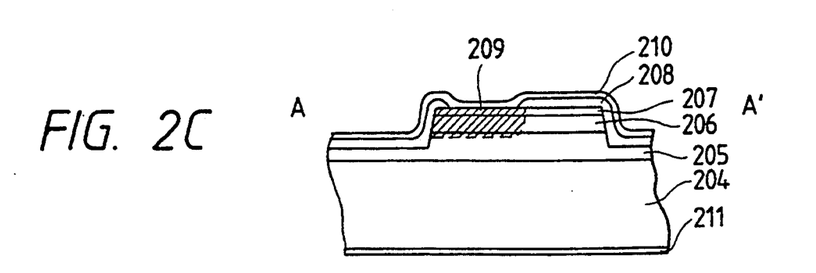

The structure of the optical switch array and that of an optical switch constituting the array, which have heretofore been proposed by the present inventors, will be explained with reference to FIGS. 2A, 2B and 2C. A 4×4 optical switch array is shown in FIG. 2A. A plurality of optical waveguides are provided on a semiconductor substrate. The plurality of waveguides have a plurality of X-crossing waveguides and are optically coupled to optical fibers 201 on the signal input side and optical fibers 202 on the signal output side. An enlarged view of a unit cell of an optical switch that constitues an X-crossing waveguide is shown in FIG. 2B. An additional waveguide is connected to respective parts of waveguides that cross each other in the shape of an X, thus defining two Y-branches 203. These waveguides 206 are produced in such a manner that a semiconductor material, for example, inGaAsP, is grown on an InP substrate 204 to provide a layer 205, which is then subjected to, for example, reactive ion-beam etching using $Cl_2$ or the like with a photoresist used as a mask, thereby forming a ridge-shaped structure. The sectional area of the ridge waveguides 206 is about 5 μm width × 1.5 μm height. The sectional view of the optical switch shown in FIG. 2B, taken along the line A-A' is shown in FIG. 2C on the InP substrate 204 are successively grown a waveguide layer 205 (bandgap wavelength: 1.15 μm) of n-InGaAsP, a cladding layer 206 of n-InP and a cap layer 207 of n-inGaAsP by ordinary LPE (Liquid Phase Epitaxy) method. After a carrier injection region 209 has been formed by diffusion of Zn or the like, an insulator layer 208 of $SiO_2$ or the like and a p-side electrode 210 are formed thereon by evaporation or other similar means. An n-side electrode 211 is similarly provided on the reverse side of the InP substrate 204. This optical switch, which utilizes a refractive index change on the basis of carrier injection, is relatively large in the amount of change in the refractive index of the constituent material and therefore suitable, particularly, for fabricating an optical switch array having small-sized optical switches and a large number of light input and output waveguides.

However, it was found as a result of further studies made by the present inventors that the above-described optical switch or optical switch array involves some propagation losses, for example, increases in the loss and crosstalk caused by scattering of light at the branches and inferior optical switch characteristics, and waveguide loss intrinsic to the waveguides. These propagation losses are technical problems which cannot be ignored when it is intended to integrate optical switches in a large size and at a high density.

SUMMARY OF THE INVENTION

The present invention aims at solving the above-described technical problems of the prior art and relates to an optical switch having novel functions and an optical switch array employing the same.

According to one aspect of the present invention, there is provided a semiconductor optical switch comprising: a first waveguide for guiding a light wave; a second waveguide for guiding the light wave; propagation direction changing means disposed between the first and second waveguides to change the direction of propagation of the light wave propagated through the first waveguide; a third waveguide connecting together the first and second waveguides to guide the light wave from the first waveguide to the second waveguide; and light wave amplifying means provided on the third waveguide to amplify the light wave propagated through the third waveguide. By providing the light wave amplifying means on the third waveguide in addition to the propagation direction changing means, the light wave is amplified without amplifying an unnecessary noise component, thereby realizing a switch of low loss. A semiconductor laser structure may be employed as the light wave amplifying means. Semiconductor lasers have an optically active region. The states of the optically active region may be classified into three, that is, lasing state, amplifying state and absorbing state in accordance with the level of the carrier energy injected into the region. The present invention positively utilizes the amplifying state or the absorbing state of the three states. Such a semiconductor laser structure is optically connected to the third waveguide. In a preferred from of the present invention, a semiconductor optical switch is realized by combining the above-described light wave amplifying means with the propagation direction changing means that utilizes a change in the refractive index of a semiconductor medium induced by carrier injection from an electrode. According to one limited aspect of the present invention, the operating timing of the light wave amplifying means and the operating timing of the propagation direction changing means are synchronized with each other.

This synchronization may be obtained by activating the light wave amplifying means and the propagation direction changing means by use of a common electrode.

According to another limited aspect of the present invention, the above-described semiconductor optical switch further comprises a fourth waveguide which is different from the second waveguide for guiding the light wave propagated through the first waveguide. In such a semiconductor optical switch, the propagation direction changing means propagates the light wave propagated through the first waveguide to either the second or fourth waveguide in response to a signal externally applied to the propagation direction changing means.

According to another limited aspect of the present invention, the above-described semiconductor optical switch further comprises a fifth waveguide for guiding a second light wave other than the first light wave propagated through the first waveguide. Thus, the second waveguide propagates either the first or second light wave by the operation of the propagation direction changing means in response to a signal externally applied to the propagation direction changing means. The fifth waveguide is (optically) connected to the propagation direction changing means such that the second light wave propagated through the fifth waveguide will not be propagated through the third waveguide. The second waveguide propagates either the first or second light wave in response to a signal externally applied to the propagation direction changing means.

According to another limited aspect of the present invention, the light wave amplifying means of the above-described semiconductor optical switch has a monitor function for light wave discrimination. Such a semiconductor optical switch makes it possible to discriminate between the first and second light waves. As the light-wave amplifying means having a monitor function, the above-described one that utilizes a semiconductor laser structure may be employed, for example. The light wave amplifying means of the semiconductor optical switch is connected with discrimination means for the light wave discrimination.

According to another aspect of the present invention, the light wave amplifying means of the semiconductor optical switch has a gate function. In this semiconductor optical switch, the light wave amplifying means absorbs the first light wave when the first light wave need not be guided to the second waveguide.

According to still another aspect of the present invention, there is provided a semiconductor optical switch comprising: a plurality of input waveguides and a plurality of output waveguides; a plurality of switching function portions respectively disposed at the intersections of the input and output, waveguides: and a plurality of light wave amplifying means provided in the switching function portions, respectively. Since such a semiconductor optical switch has a light wave amplifying means in each switching function portion, a specific light wave alone is amplified in each switching function portion.

According to one limited aspect of the present invention, the switching function portions of the above-described semiconductor optical switch have bypass waveguides which propagate only a light wave propagated through a specific one of the input waveguides, the light wave amplifying means being respectively provided in the bypass waveguides.

According to a further aspect of the present invention, there is provided a semiconductor optical switch which receives a plurality of input light waves, amplifies only a specific input light wave selected from among the input light waves and outputs the amplified input light wave. According to such a semiconductor optical switch, the specific output light wave includes substantially no amplified input light waves other than the specific input light wave.

According to one limited aspect of the present invention, there is provided a semiconductor optical switch array comprising a combination of a plurality of semiconductor optical switches as set forth above. By combining together a plurality of semiconductor optical switches according to the present invention in a parallel or multistage form, it is possible to realize a semiconductor optical switch array in which low loss and low crosstalk are achieved throughout the device.

According to a still further aspect of the present invention, there is provided a semiconductor optical switch comprising optical amplifying means provided in a bypass waveguide which is defined by part of the slip of either a single or double slip structure type optical switch.

In the prior art, the light that is guided through a light wave modulating means, for example, an optical switch, is after the modulation, optically amplified at the output end, for example. The propagation loss in the light wave modulating means is compensated for by the optical amplification but, at the same time, an unnecessary light wave component that is mixed in the light due to crosstalk or the like in the light wave modulating means is also optically amplified and consequently the noise component in the output light wave does not decrease. It is necessary in order to solve this problem to subject only the required light wave to optical amplification. However, if this optical amplification is conducted before the light reaches the light wave modulating means, the crosstalk of the required light wave increases instead, which similarly results in a lowering in the output margin of the semiconductor-optical switch.

Accordingly, if the optical amplification function is imparted to the switching function portion of an optical switch, all the above-described problems are solved. More specifically, the switching function portion has a portion which selects a specific light wave (in other words, changes the direction of propagation), and if the light wave is optically amplified after passing through this portion, it is possible to amplify only the required light wave. However, if the light is optically amplified after passing through the switching function portion (specifically, in the output waveguide), the result is the same as in the case of the amplification conducted at the output end, which is meaningless. It should be noted that the switching function portion in the present invention is a region which is disposed between an input waveguide and an output waveguide and which has a function for deflecting light.

Originally, the amplification region of a semiconductor laser or the like functions as an absorbing portion when not excited and amplifies when sufficiently excited. The third waveguide, or the bypass waveguide that is part of the slip of either a single or double slip structure type optical switch, in the present invention has a function by which only an optical signal to be exchanged passes therethrough, which is not present in any conventional optical switches. Therefore, if an optical amplification function is imparted to this bypass waveguide, it is possible to enable the bypass waveguide to function as an absorbing portion when the optical switch is in an OFF-state (a state wherein no optical signal passes through the bypass waveguide) and function as an amplification portion when the optical switch is in ON-stage (a state wherein an optical signal passes through the bypass waveguide). As a result, the crosstalk is markedly reduced and consequently the loss is reduced or the optical signal is amplified in accordance with the amplification degree in the amplification portion. Further, since the optical amplification portion is present inside each optical switch, the amplification degree can be individually adjusted when optical switches of the type described above are integrated in a large scale and it is therefore possible to obtain uniform characteristics of the resulting optical switch array. Since it is also possible to convert the light absorbed in the optical amplification portion into an electrical signal and read it, the optical amplification portion can be used as an optical signal monitor. Accordingly, when the present invention is applied to an optical processing apparatus such as a photonic switching, it is possible to discriminate between cells and judge the end of a call, for example. If the present invention is employed together with a carrier injection type optical switch system, carrier injection can be used for both the switching and amplifying functions and it is therefore possible to readily realize an optical switch having a small size and high function. Thus, it is possible to realize an optical switch array for an optical exchange which is small in size and superior in crosstalk characteristics and low-loss characteristics.

Still further advantages of the present invention will become apparent to those of ordinary skill in the art upon reading and understanding the following detailed description of the preferred embodiments.

BRIEF DESCRIPTION OF THE DRAWINGS

The invention may take form in various parts and arrangements of parts. The drawings are only for purpose of illustrating the preferred embodiments and are not to be contrued as limiting the invention.

DETAILED DESCRIPTION OF THE PREFERRED EMBODIMENTS

Figure 1A:
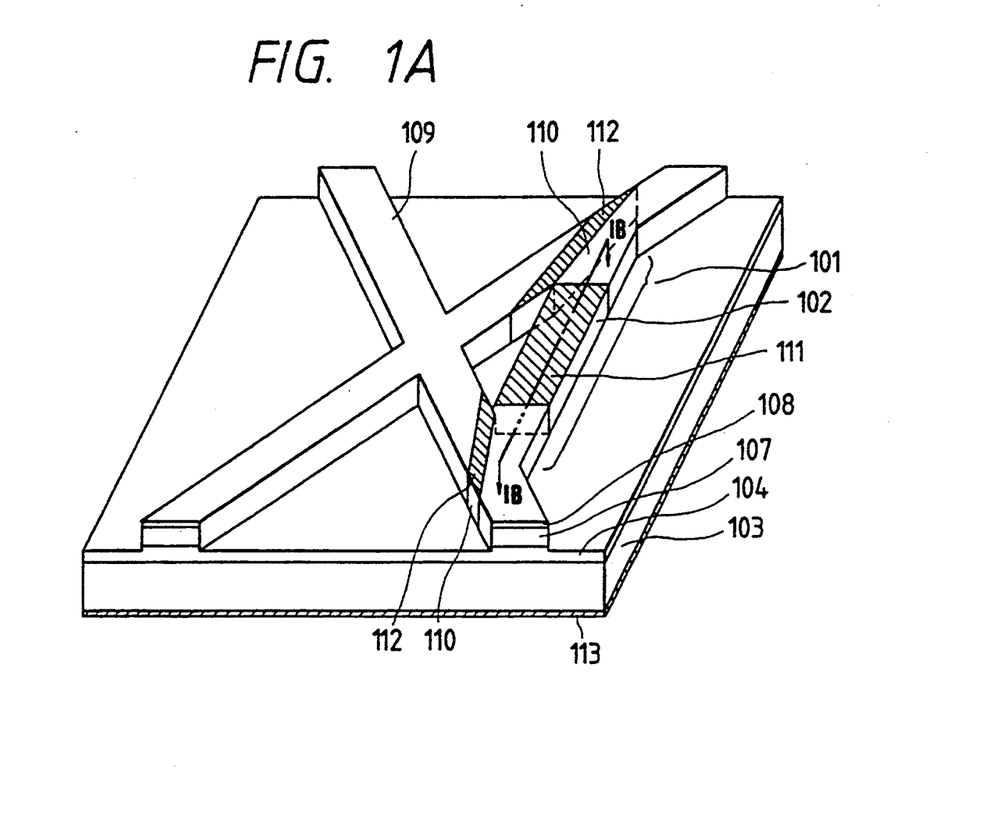
FIG. 1A is a view for illustrating the concept of the arrangement of the present invention.
Figure 1B:
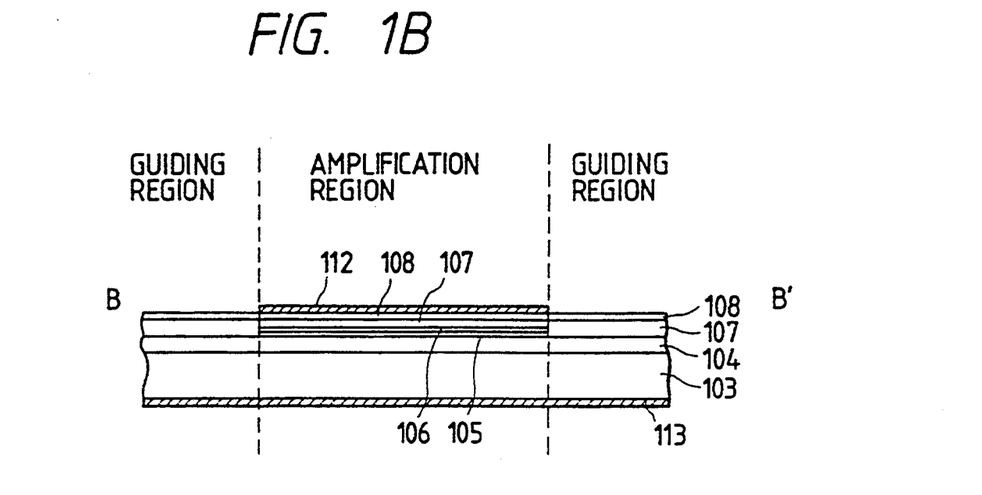
FIG. 1B shows one example of the cross-sectional structure of the amplification region in the bypass waveguide of the optical switch according to the present invention.

With reference to FIGS. 1A and 1B, one embodiment in which the present invention is applied to a so-called single slip structure type optical switch will be explained. FIG. 1A is a perspective view of the optical switch, in which a bypass waveguide 101 which has a single slip structure is provided with an optical amplification portion 102. FIG. 1B shows the cross-sectional structure (taken along the line B-B' of FIG. 1A) of the bypass waveguide 101.

Figure 4A:
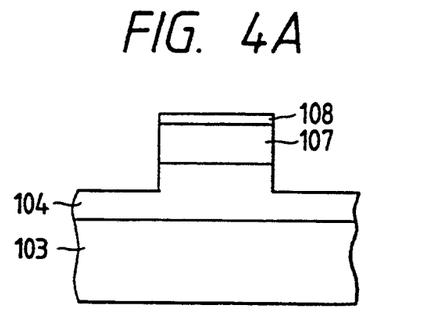
FIGS. 4A, 4B and 4C are views for illustrating one example of the cross-sectional structure of the optical switch according to the present invention.
Figure 4B:
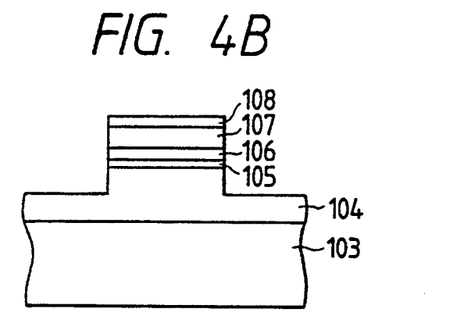
Figure 4C:
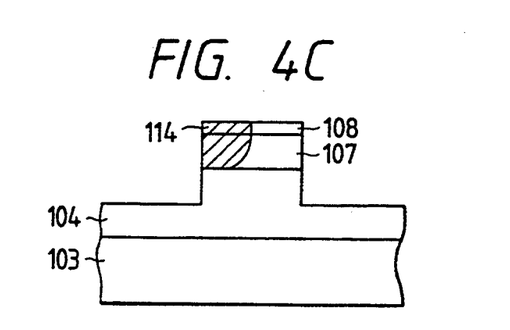
Figure 5:
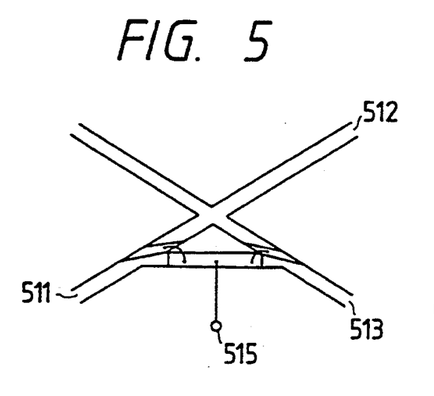
FIG. 5 is a view for illustrating one embodiment of the optical switch according to the present invention.
Figure 6:
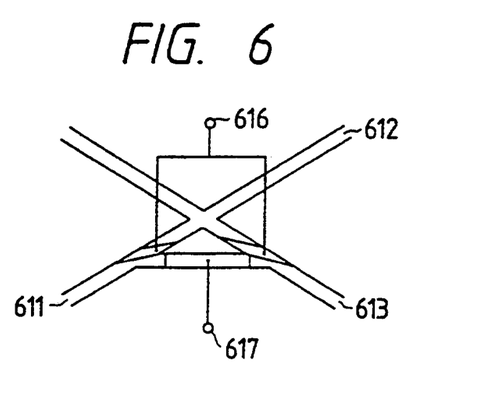
FIG. 6 is a view for illustrating another embodiment of the optical switch according to the present invention.

In this embodiment, an InGaAsP waveguide layer 104 (absorption edge wavelength $\lambda g = 1.15$ $\mu$m), an InP barrier layer 105, an InGaAsP waveguide layer 106 (absorption edge wavelength $\lambda g = 1.30$ $\mu$m), an InP cladding layer 107 and an InGaAsP cap layer 108 were successively grown on an InP substrate 103 by LPE method. Thereafter, the InGaAsP cap layer 108 was removed and the InP cladding layer 107 and the InGaAsP waveguide layer 106 were removed except for those portions in the amplification region within the bypass waveguide by selective etching method. Then, an InP cladding layer 107 and an InGaAsP cap layer 108 were grown again on the whole surface. Thereafter, waveguides having the cross-sectional configuration shown in FIGS. 4A and 4B were formed by ordinary lithography and etching techniques, as being waveguides 109 which were out of the amplification portion and as being a waveguide which was in the amplification portion 101. The waveguides thus formed had a width of 5 $\mu$m. The X-crossing angle of the waveguides was 14°, and the Y-branch angle of the waveguides was 7°. The optical switch thus formed was provided with carrier injection regions 110 for an optical switch operation and electrodes 112 for carrier injection into the associated regions by use of ordinary electrode forming technique. FIG. 4C shows the cross-sectional structure of a waveguide including a carrier injection region 110 of the optical switch formed as described above. To form the carrier injection regions 110, Zn diffusion method was employed. Other features of the waveguide structure shown in FIGS. 4A and 4B are that the junction loss is small since the waveguide layer 104 is common to the amplification portion and the optical switch portion and that the polarization dependence is small since the optical amplification layer 106 amplifies the evanescent component in the guided light. The operation of the thus produced optical switch will next be explained with reference to FIGS. 5 and 6. In characteristic evaluation, semiconductor laser light having a wavelength of 1.3 $\mu$m was applied to the input end 511. In the arrangement shown in in FIG. 5, the electrodes of the optical switch portion and the amplification portion were connected to provide a common terminal 515 to drive both the carrier injection portions at the same time. At that time, the output end 512 was substantially completely switched to the output end 513 when the injection current was about 200 mA, and the insertion loss and the crosstalk were 3 dB and −30 dB, respectively, which were 5 dB and 10 dB smaller than those of a device provided with no optical amplification portion. Next, the two carrier injection portions were individually driven by use of the arrangement shown in FIG. 6, that is, by use of terminals 616 and 617 provided in connection with the respective electrodes of the optical switch portion and the optical amplification portion. When the optical switch portion and the optical amplification portion were supplied with injection currents of about 120 mA and about 200 mA, respectively, the direction of propagation of the light with a wavelength of 1.3 μm input from the input end 611 was substantially completely changed from the output end 612 to the output end 613. The insertion loss and the crosstalk were −2 dB and −30 dB, respectively. That is, it was possible to obtain a gain of 2 dB. As a result, it was possible to confirm the basic functions of the present invention for reducing or eliminating loss and reducing crosstalk.

Figure 3A:
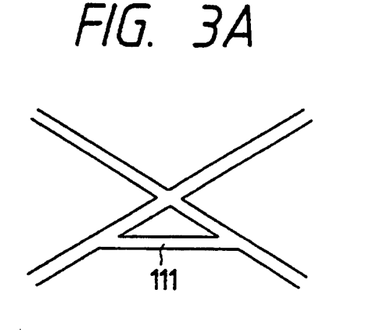
FIGS. 3A and 3B are views for illustrating structures in the case where the present invention is realized in the form of single and double slip structure optical switches, respectively.
Figure 3B:
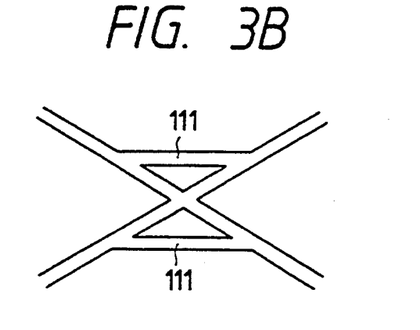
Figure 10:
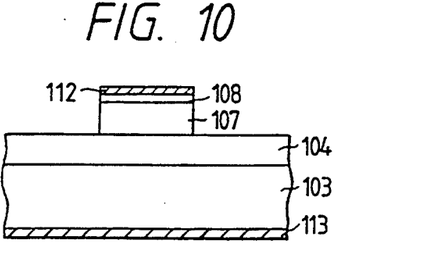
FIGS. 10, 11 and 12 are views for illustrating the cross-sectional structures of other embodiments of the optical switch according to the present invention.
Figure 11:
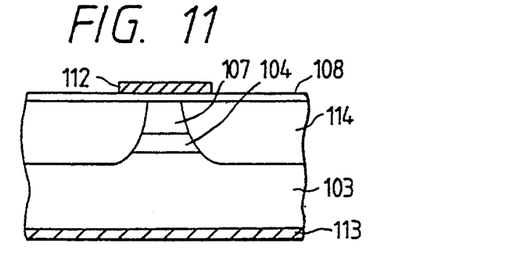
Figure 12:
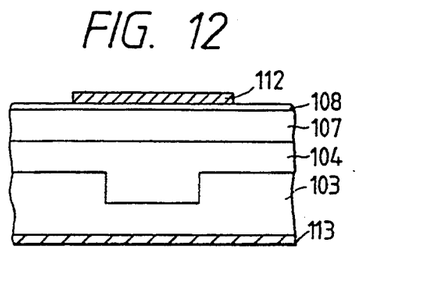

Although in this embodiment the range structure shown in FIG. 3 was employed for the waveguides, it is, of course, possible to obtain the same advantageous effects by use of gain type optical waveguide structures in addition to refractive index type optical waveguide structures such as those of loaded type, BH type and CSP type, which are ordinary optical waveguide structures. FIGS. 10, 11 and 12 respectively shows examples of specific optical waveguide structures of loaded type, BH type and CSP type. When these optical waveguide structures are employed, it is also preferable to reduce the loss in the junction between the amplification portion and the switch portion and reduce the polarization dependence in the amplification portion as in the ridge type waveguide structure of the foregoing embodiment. It should be noted that the reference numeral 114 in FIG. 11 denotes a buried layer (region) which is a semiconductor (InP or the like) region for confining the light propagated through the waveguide region 104 and the injected current within the mesa region in the center. Further, although in the foregoing embodiment an InGaAsP material was employed as a semiconductor material, the same advantageous effect is also obtained by use of other semiconductor materials such as III–V group semiconductor materials such as GaAlAs, InGaAlAs, etc. and II–VI group semiconductor materials.

Figure 7:
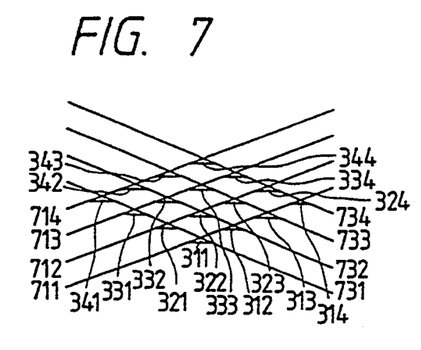
FIGS. 7 and 9 are views for illustrating embodiments of the optical switch array according to the present invention.

With reference to FIG. 7, one embodiment of the optical switch array according to the present invention will be explained.

Figure 8:
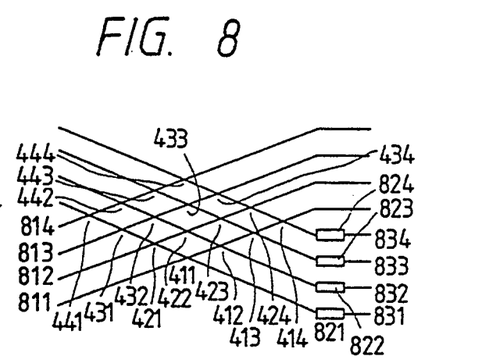
FIG. 8 shows the structure of a conventional optical switch array.

In this embodiment, 16 semiconductor optical switches of the type shown in FIG. 1A were integrated to produce a complete lattice-type 4×4 optical switch array having 4 inputs and 4 outputs, as shown in the figure. Since the bypass waveguide that is part of the slip of the single or double slip structure type optical switch according to the present invention has a function by which only an optical signal which is to be exchanged passes therethrough, which is unavailable in the conventional optical switches, it is possible to realize an optical exchange function which is not present in the prior art. With the prior art arrangement, i.e., the arrangement shown in FIG. 8 wherein optical amplifiers are disposed at the input or output ends, respectively, in an optical switch array, the output ends 831, 832, 833 and 834 to which optical signals input from the input ends 811, 812, 813 and 814 are to be output depend on which ones of the switch units disposed at the lattice points in the optical switch array turn ON, and since the path, length, etc. of the waveguides differ depending upon each particular connecting condition, if the optical amplifiers 821, 822, 823 and 824 disposed at the input or output ends are operated under a constant condition, it is impossible to adjust variations in loss due to the connecting condition. For example, optical signals from the input ends 811, 812, 813 and 814 are output to the output end 831 when the switch units 411, 421, 431 and 441 turn on, respectively. Since the length and condition of the waveguides differ for each path, the loss value differs for each path, as a matter of course In contrast, the optical switch array shown in FIG. 7 that comprises semiconductor optical switches of the present invention enables adjustment loss variations due to the difference in path, length, etc. of the waveguides depending upon the connecting condition since a switch unit disposed at each lattice point has each individual optical amplification function. More specifically, since the path from an input end to an output end is uniformly determined by which one(s) of the switch units at the lattice points turn ON, it suffices to unconditionally determine an amplification degree at each lattice point in accordance with the loss in this path. In this embodiment, in order to confirms this function, the optical amplification degrees of four switch units 311, 312, 313 and 314 in the arrangement shown in FIG. 7 were individually adjusted so that the optical signal input from the input end 711 was output to the output ends 731, 732, 733 and 734 with the same light intensity and so that the insertion loss was 5 dB. The values of the current required were 200, 220, 230 and 260 mA, respectively. Similarly, the optical amplification degrees of the remaining 12 switch units 321, 322, 323, 324, 331, 332, 333, 334, 341, 342, 343 and 344 were individually adjusted so that the optical signals input from the input ends 712, 713 and 714 were output to the output ends 731, 732, 733 and 734 with the same light intensity and so that the insertion loss was 5 dB. As a result, it was possible to confirm the novel function of the present invention that an optical signal input from any input end is output to any output end with the same light intensity.

Figure 9:
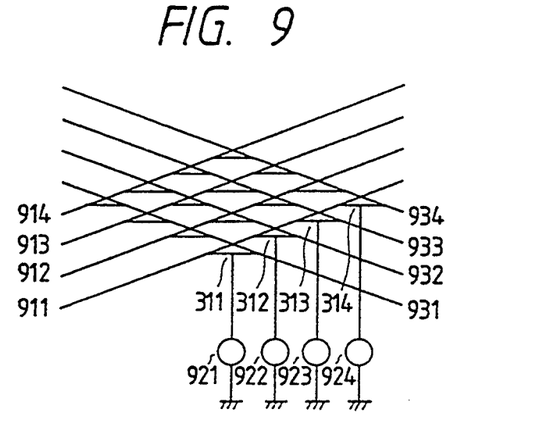

With reference to FIG. 9, one embodiment of an optical exchange that utilizes the optical signal monitor function of the present invention will be explained. An optical signal input from the input end 911 was monitored on the basis of a change in the terminal voltage in the optical amplification portion of each of the switch units 311, 312, 313 and 314 (in the figure, the reference numerals 921 to 924 denote optical switch unit driving power supplies having a voltage monitor circuit and therefore serving also as monitor means), thereby reading the header portion in the optical signal to discriminate an output end to be connected from the others. In response to the signal discriminated, the corresponding switch unit 312 was turned ON so that the signal would be output to the corresponding output end 932. Further, in this state, the contents of the signal were monitored on the basis of a change in the terminal voltage in the optical amplification portion of the switch unit 312 to distinguish the point of time of the end of the call, and when the call finished, the switch unit 312 was turned OFF to cut off the connection to the output end 932. As a result, it was possible to confirm the optical signal monitor function of the present invention and that it is possible to realize an optical exchange having a high level of function.

Figure 13:
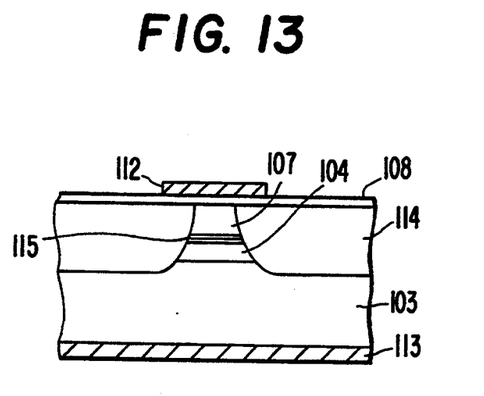
FIGS. 13-15 show a sectional structure, frequency conversion and a longitudinal section of the present invention respectively.

FIG. 13 shows a sectional structure of an optical waveguide when a multi-quantum well structure 115 is employed as the optical amplification layer. This multi-quantum well structure 115 is the so-called strained super lattice structure which is exemplified by forming layers of InGaAs having a thickness of 10 nm and layers of InGaAsP having a thickness of 10 nm alternately, ten layers in all. Thus, there can be formed optical switches and polarization independence optical amplifiers which have substantially identical characteristics independently of the polarization states of incident optical waves. In FIG. 13, an optical waveguide having a BH structure is provided with the multi-quantum well structure 115. Similar advantageous effects can be produced by providing other optical waveguide structures such as of a ridge type, a loaded type or a CSP type with this multi-quantum well structure 115.

Figure 14:
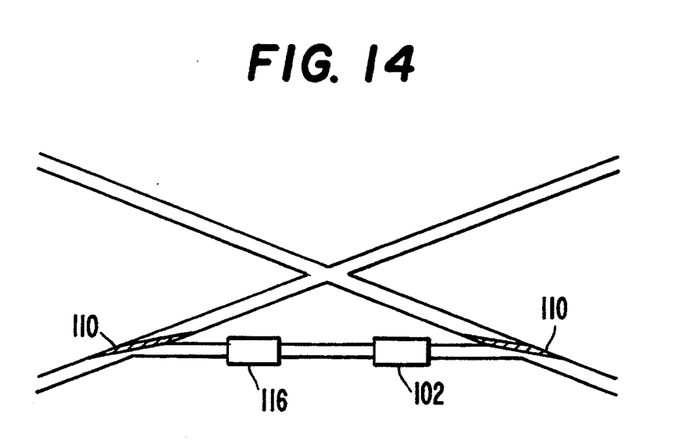

In a structure shown in FIG. 14, an optical frequency conversion portion or optical frequency filter portion 116 is coupled in series to the optical amplification portion 102 of the bypass waveguide. This optical frequency conversion portion or optical frequency filter portion 116 is constructed of, for example, an optical frequency (or wavelength) conversion layer and is made of the same material as that of the optical amplification portion 102 coupled in series thereto.

Figure 15:
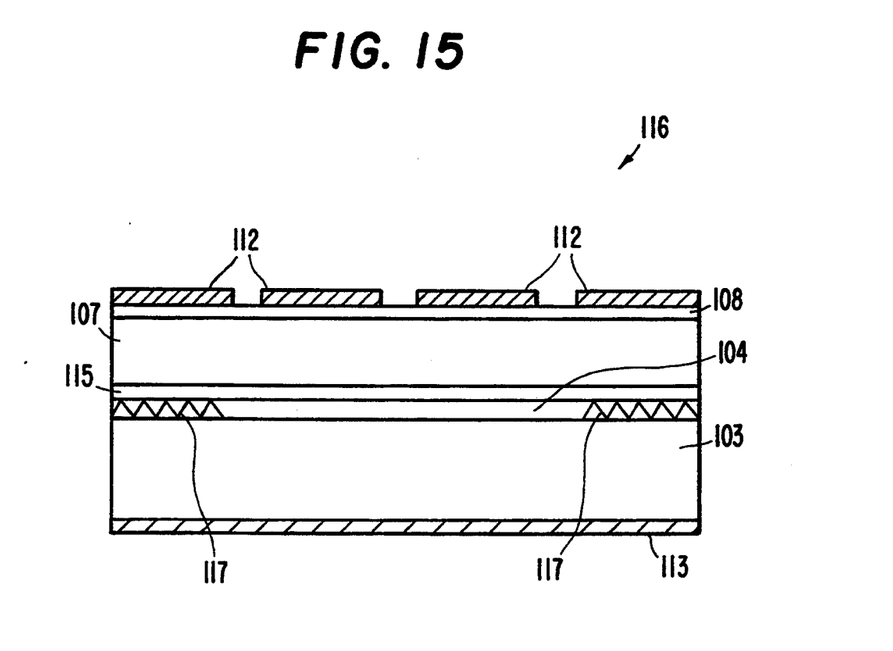

FIG. 15 is a longitudinal section showing a structure of the optical frequency conversion portion or optical frequency filter portion 116, whose transverse section is similar to that of FIG. 13. This optical frequency conversion portion or optical frequency filter portion 116 is equipped with a diffraction grating 117 for changing the distribution value of a current to be applied to electrodes 112, so that the optical frequency of oscillation can be set. The frequency conversion portion 116 is adapted to oscillate when input light is applied to it, and to stop its oscillation when input light is not applied. As a result, the intensity-modulated input light can be converted to light having a different optical frequency (or wavelength). Thus, the incident light waves can be subjected to optical frequency conversion or filtering processing. This means that the optical switch of the present invention can switch the optical paths with a low loss, and can realize frequency converting or filtering processing at the same time. In short, the optical switch can use the space and the frequency axis in common as the optical converter for a switchboard. As a result, the range, to which the present invention is applied, can be drastically expanded.

The optical frequency conversion portion or optical frequency filter portion 116, as embodied in the present embodiment, can readily be introduced into, for example, a space type optical switch having 4-input ends and 4-output ends, to exchange signals between 4-frequency multiplexed optical waves. Such a structure is equivalent to a space type optical switch having 16-input ends and 16-output ends.

Having thus described the preferred embodiments, the invention is now claimed to be:

1. An X-crossing optical waveguide including a pair of optical waveguides intersecting one another at a crossing point to form an X shape structure having first, second, third and fourth optical waveguide legs, comprising:
   a first bypass waveguide coupled between the first and second optical waveguide legs, including an optical amplification portion having a multi-quantum well structure;
   a first carrier injection region located between the crossing point of the X-crossing waveguide and a coupling point of the first optical waveguide leg and the first bypass waveguide; and
   a second carrier injection region located between the crossing point of the X-crossing waveguide and a coupling point of the second optical waveguide leg and the first bypass waveguide.

2. The X-crossing optical waveguide according to claim 1, further comprising:
   a second bypass waveguide leg including an optical amplification portion having a multi-quantum well structure;
   a third carrier injection region located between the crossing point of the X-crossing waveguide and a coupling point of the third optical waveguide leg and the second bypass waveguide; and
   a fourth carrier injection region located between the crossing point of the X-crossing waveguide and a coupling point of the fourth optical waveguide leg and the second bypass waveguide.

3. An optical device array comprising a plurality of X-crossing optical waveguides forming a lattice pattern, each of the X-crossing optical waveguides including a pair of optical waveguides intersecting one another at a crossing point to form an X shape structure having first, second, third and fourth optical waveguide legs, comprising:
   a first bypass waveguide coupled between the first and second optical waveguide legs, including an optical amplification portion having a multi-quantum well structure;
   a first carrier injection region located between the crossing point of the X-crossing waveguide and a coupling point of the first optical waveguide leg and the first bypass waveguide; and
   a second carrier injection region located between the crossing point of the X-crossing waveguide and a coupling point of the second optical waveguide leg and the first bypass waveguide.

4. The optical device array according to claim 3, wherein each of the X-crossing optical waveguides further comprises:
   a second bypass waveguide coupled between the third and fourth optical waveguide legs, including an optical amplification portion having a multi-quantum well structure;
   a third carrier injection region located between the crossing point of the X-crossing waveguide and a coupling point of the third optical waveguide leg and the second bypass waveguide; and
   a fourth carrier injection region located between the crossing point of the X-crossing waveguide and a coupling point of the fourth optical waveguide leg and the second bypass waveguide.

5. An X-crossing optical waveguide including a pair of optical waveguides intersecting one another at a crossing point to form an X shape structure having first, second, third and fourth optical waveguide legs, comprising:
   a first bypass waveguide coupled between the first and second optical waveguide legs, including an optical amplification portion coupled in series with an optical frequency conversion portion or an optical frequency filter portion;
   a first carrier injection region located between the crossing point of the X-crossing waveguide and a coupling point of the first optical waveguide leg and the first bypass waveguide; and
   a second carrier injection region located between the crossing point of the X-crossing waveguide and a coupling point of the second optical waveguide leg and the first bypass waveguide.

6. The X-crossing optical waveguide according to claim 5, further comprising:
   a second bypass waveguide leg including an optical amplification portion coupled in series with an optical frequency conversion portion or an optical frequency filter portion;

a third carrier injection region located between the crossing point of the X-crossing waveguide and a coupling point of the third optical waveguide leg and the second bypass waveguide; and a fourth carrier injection region located between the crossing point of the X-crossing waveguide and a coupling point of the fourth optical waveguide leg and the second bypass waveguide.

7. An optical device array comprising a plurality of X-crossing optical waveguides forming a lattice pattern, each of the X-crossing optical waveguides including a pair of optical waveguides intersecting one another at a crossing point to form an X shape structure having first, second, third and fourth optical waveguide legs, comprising:

a first bypass waveguide coupled between the first and second optical waveguide legs, including an optical amplification portion coupled in series with an optical frequency conversion portion or an optical frequency filter portion;

a first carrier injection region located between the crossing point of the X-crossing waveguide and a coupling point of the first optical waveguide leg and the first bypass waveguide; and a second carrier injection region located between the crossing point of the X-crossing waveguide and a coupling point of the second optical waveguide leg and the first bypass waveguide.

8. The optical array according to claim 7, wherein each of the X-crossing optical waveguides further comprises:

a second bypass waveguide coupled between the third and fourth optical waveguide legs, including an optical amplification portion coupled in series with an optical frequency conversion portion or an optical frequency filter portion;

a third carrier injection region located between the crossing point of the X-crossing waveguide and a coupling point of the third optical waveguide leg and the second bypass waveguide; and a fourth carrier injection region located between the crossing point of the X-crossing waveguide and a coupling point of the fourth optical waveguide leg and the second bypass waveguide.

* * * * *